(12) United States Patent
Yu et al.

(10) Patent No.: US 11,744,032 B2
(45) Date of Patent: Aug. 29, 2023

(54) CARRYING STRUCTURE AND SERVER

(71) Applicant: Wistron Corporation, New Taipei (TW)

(72) Inventors: Zhi-Tao Yu, New Taipei (TW); Hai-Nan Qiu, New Taipei (TW); Yong-Liang Zheng, New Taipei (TW)

(73) Assignee: Wistron Corporation, New Taipei (TW)

(*) Notice: Subject to any disclaimer, the term of this patent is extended or adjusted under 35 U.S.C. 154(b) by 455 days.

(21) Appl. No.: 16/940,397

(22) Filed: Jul. 28, 2020

(65) Prior Publication Data
US 2021/0385958 A1 Dec. 9, 2021

(30) Foreign Application Priority Data
Jun. 4, 2020 (CN) .......................... 202010500961.4

(51) Int. Cl.
*G06F 1/16* (2006.01)
*H05K 5/00* (2006.01)
*H05K 7/00* (2006.01)
*H05K 5/02* (2006.01)
*H05K 7/14* (2006.01)

(52) U.S. Cl.
CPC ......... *H05K 5/0295* (2013.01); *H05K 7/1418* (2013.01); *H05K 7/1429* (2013.01)

(58) Field of Classification Search
CPC ... H05K 5/0295; H05K 7/1418; H05K 7/1429
See application file for complete search history.

(56) References Cited

U.S. PATENT DOCUMENTS 9,826,658 B1 * 11/2017 Mao ..................... G06F 1/183
9,921,616 B1   3/2018 Yuan
11,310,932 B2 * 4/2022 Chang .................. H05K 7/16
(Continued)

FOREIGN PATENT DOCUMENTS

TW   I620492   4/2018

OTHER PUBLICATIONS

"Office Action of Taiwan Counterpart Application", dated Nov. 10, 2021, p. 1-p. 9.
(Continued)

*Primary Examiner* — Anthony M Haughton
(74) *Attorney, Agent, or Firm* — JCIPRNET

(57) ABSTRACT

A carrying structure including a carrying main body, two engaging components, two driven linkages, and a driving linkage is provided. The carrying main body is adapted to carry an expansion card. The two engaging components are disposed on opposite ends of the carrying main body, each of the engaging components is adapted to be actuated to an engaging state for being engaged to a server main body, and each of the engaging components is adapted to be actuated to a releasing state for being separated from the server main body. The two driven linkages are respectively connected to the two engaging components. The driving linkage is connected between the two driven linkages and adapted to drive the two engaging components to be simultaneously actuated between the engaging state and the releasing state by the two driven linkages. In addition, a server having the carrying structure is also provided.

20 Claims, 21 Drawing Sheets

(56) References Cited

U.S. PATENT DOCUMENTS

| 2005/0186813 A1* | 8/2005 | Lohr ..................... H01R 12/57 |
| | | 439/79 |
| 2005/0186816 A1 | 8/2005 | Franz et al. |
| 2015/0085451 A1* | 3/2015 | Yu ......................... G06F 1/185 |
| | | 361/747 |
| 2020/0229311 A1* | 7/2020 | Wu ..................... H05K 7/1487 |
| 2021/0045261 A1* | 2/2021 | Huang ................ H05K 7/1489 |
| 2022/0124931 A1* | 4/2022 | Kuang ................ H05K 7/1411 |

OTHER PUBLICATIONS

"Office Action of Taiwan Counterpart Application", dated May 4, 2021, p. 1-p. 6.

* cited by examiner

CARRYING STRUCTURE AND SERVER

CROSS-REFERENCE TO RELATED APPLICATION

This application claims the priority benefit of China application serial no. 202010500961.4, filed on Jun. 4, 2020. The entirety of the above-mentioned patent application is hereby incorporated by reference herein and made a part of this specification.

BACKGROUND

Technical Field

The disclosure relates to a carrying structure and a server, and particularly relates to a carrying structure for carrying an expansion card and a server having the carrying structure.

Description of Related Art

In order to improve the performance of a server, an expansion card, such as a display card and/or a memory card, is usually added to the server. The expansion card is generally carried by a carrying structure. The carrying structure is engaged to a partition board of the server by the rotating handles at two opposite ends of the carrying structure, so that the expansion card is fixed and inserted into a motherboard of the server through a connector of the expansion card. If a user exerts different forces to the two rotating handles at different speeds and/or rotation angles during installation or disassembly of the expansion card, the connector of the expansion card may be easily tilted and be subject to improper forces, resulting in damages to the connector. Further, the connector of the general expansion card is disposed at one end of the expansion card; therefore, it is necessary to exert different forces to the rotating handles at the opposite ends of the carrying structure, so that the connector of the expansion card may be inserted and removed without being tilted. However, it is difficult for the user to control the force applied exerted to the two rotating handles, and thus the connector of the expansion card may be easily damaged.

SUMMARY

The disclosure is directed to a carrying structure and a server, which may prevent damages to a connector of an expansion card.

An embodiment of the disclosure provides a carrying structure that includes a carrying main body, two engaging components, two driven linkages, and a driving linkage. The carrying main body is adapted to carry an expansion card. The two engaging components are disposed on opposite ends of the carrying main body. The two driven linkages are respectively connected to the two engaging components. The driving linkage is connected between the two driven linkages. The driving linkage is adapted to simultaneously drive the two engaging components to be actuated by the two driven linkages.

In an embodiment of the disclosure, each of the engaging components is adapted to be actuated to an engaging state for being engaged to a server main body, and each of the engaging components is adapted to be actuated to a releasing state for being separated from the server main body. The driving linkage is adapted to simultaneously drive the two engaging components to be actuated between the engaging state and the releasing state through the two driven linkages.

An embodiment of the disclosure provides a server that includes a server main body and at least one carrying structure. The at least one carrying structure includes a carrying main body, two engaging components, two driven linkages, and a driving linkage. The carrying main body is adapted to carry an expansion card. The two engaging components are disposed on opposite ends of the carrying main body, each of the engaging components is adapted to be actuated to an engaging state for being engaged to a server main body, and each of the engaging components is adapted to be actuated to a releasing state for being separated from the server main body. The two driven linkages are respectively connected to the two engaging components. The driving linkage is connected between the two driven linkages, and the driving linkage is adapted to simultaneously drive the two engaging components to be actuated between the engaging state and the releasing state by the two driven linkages.

In an embodiment of the disclosure, when the expansion card is carried by the carrying main body, an inserting portion of the expansion card is adapted to be inserted into the server main body, and a length of one of the driven linkages close to the inserting portion is greater than a length of the other driven linkage away from the inserting portion.

In an embodiment of the disclosure, the carrying structure further includes a positioning assembly. At least one portion of the positioning assembly is disposed at the carrying main body, and when each of the engaging components is in the engaging state, the driving linkage is adapted to be positioned at the carrying main body by the positioning assembly.

In an embodiment of the disclosure, the positioning assembly includes a positioning component and an elastic component. The positioning component is adapted to move to a first location to position the driving linkage by an elastic force of the elastic component, and the positioning component is adapted to resist the elastic force of the elastic component and move to a second location to release the driving linkage.

In an embodiment of the disclosure, the positioning component of the positioning assembly is slidably disposed at the carrying main body, and the elastic component is connected between the carrying main body and the positioning component.

In an embodiment of the disclosure, the positioning component of the positioning assembly is rotatably disposed at the driving linkage, and the elastic component is connected between the positioning component and the driving linkage.

In an embodiment of the disclosure, the positioning assembly includes a pillar disposed at the carrying main body, and the positioning component cooperates with the pillar to position the driving linkage.

In an embodiment of the disclosure, the elastic component is an elastic arm, and the elastic arm, the driving linkage, and the positioning component are integrally formed.

In an embodiment of the disclosure, the carrying structure further includes an elastic component connected between the driving linkage and carrying main body. The driving linkage is adapted to resist an elastic force of the elastic component and keep each of the engaging components to be in the engaging state, and the driving linkage is adapted to drive each of the engaging components to be actuated to the releasing state by the elastic force of the elastic component.

In an embodiment of the disclosure, each of the engaging components is rotatably connected to the carrying main body.

In an embodiment of the disclosure, each of the driven linkages is rotatably connected to a corresponding engaging component of the engaging components and rotatably connected to the driving linkage.

In an embodiment of the disclosure, two connection portions of the driving linkage are respectively rotatably connected to the two driven linkages, and a central portion of the driving linkage located between the two connection portions is rotatably connected to the carrying main body.

In an embodiment of the disclosure, each of the driven linkages and the driving linkage are respectively located at opposite sides of the carrying main body, the carrying main body has two open slots, and the two driven linkages are respectively connected to the driving linkage through the two open slots.

In an embodiment of the disclosure, each of the driven linkages and a corresponding engaging component of the engaging components are respectively located at opposite sides of the carrying main body, the carrying main body has two concave openings, and the two driven linkages are respectively connected to the two engaging components through the two concave openings.

In light of the foregoing, the driving linkage provided in one or more embodiments of the disclosure simultaneously drives the two engaging components to be actuated through the two driven linkages, so that the two engaging components are synchronously engaged to or separated from the server main body. Accordingly, the user may be prevented from exerting different forces to the two driven linkages at different speeds and/or rotation angles during the installation or removal of the expansion card, so that the connector of the expansion card is not tilted, and the probability of damages to the connector may be lowered.

To make the aforementioned and other features of the disclosure more comprehensible, several embodiments accompanied with drawings are described in detail as follows.

DESCRIPTION OF THE EMBODIMENTS

Figure 1:
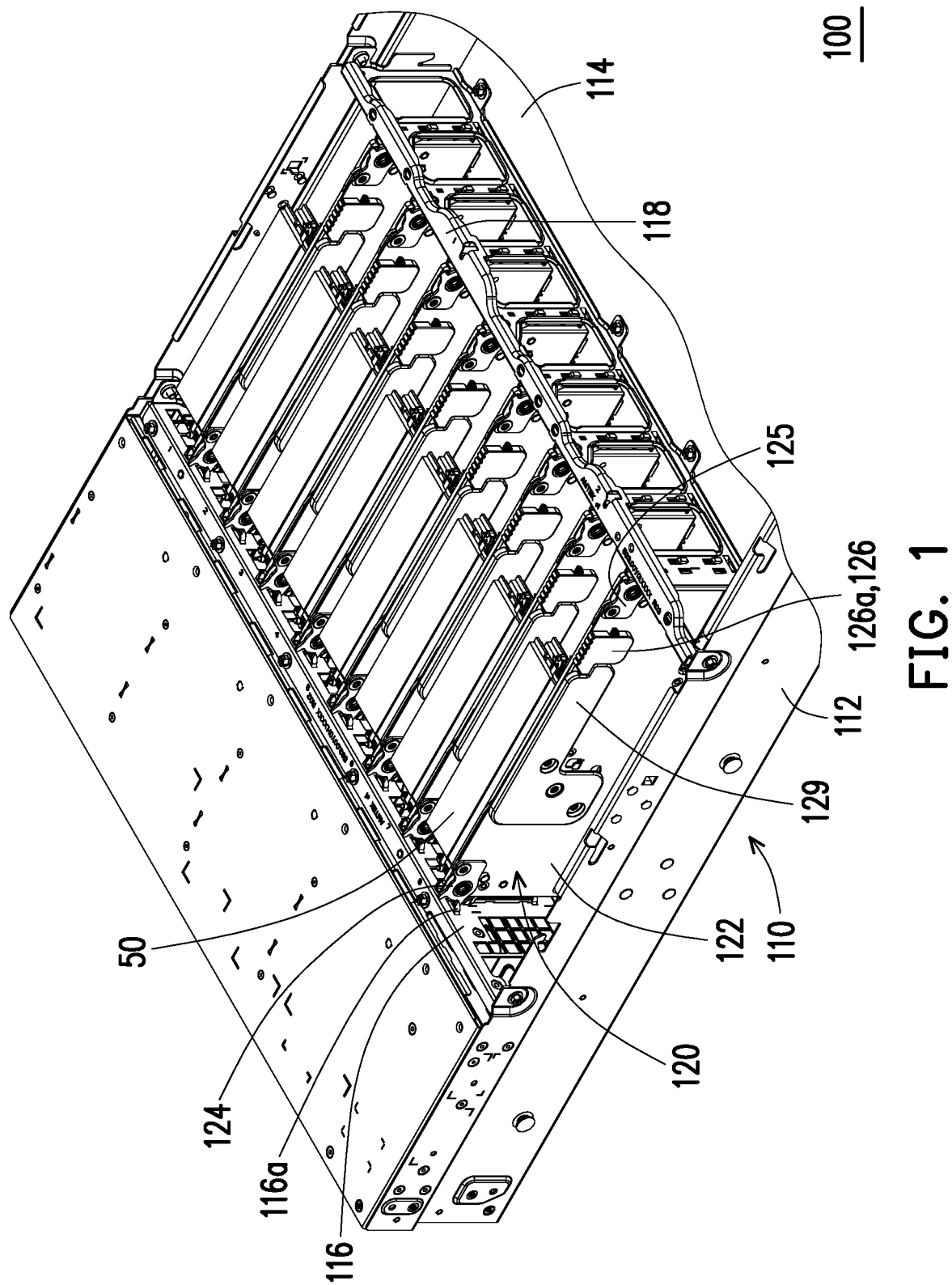
FIG. 1 is a partial three-dimensional view illustrating a server according to an embodiment of the disclosure.
Figure 2:
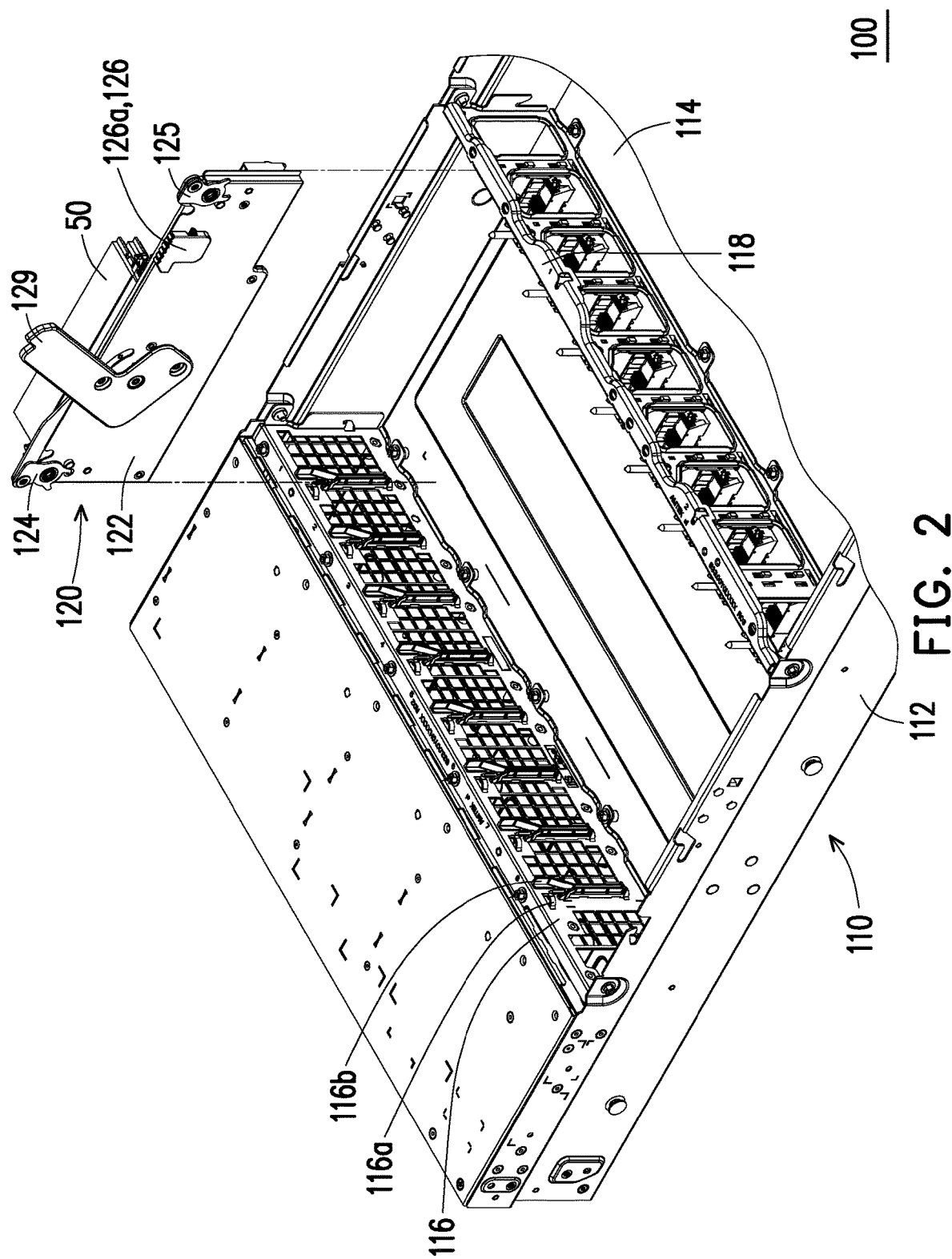
FIG. 2 is an exploded view illustrating some components of the server in FIG. 1.

FIG. 1 is a partial three-dimensional view illustrating a server according to an embodiment of the disclosure. FIG. 2 is an exploded view illustrating some components of the server in FIG. 1. With reference to FIG. 1 and FIG. 2, a server 100 provided in the embodiment includes a server main body 110 and at least one carrying structure 120 (plural carrying structures 120 are shown in FIG. 1). The server main body 110 includes a chassis 112, a motherboard 114, and two partition boards 116 and 118. The motherboard 114 and the two partition boards 116 and 118 are disposed in the chassis 112. Each of the carrying structures 120 is disposed between the two partition boards 116 and 118 and includes a carrying main body 122. The carrying main body 122 is adapted to carry an expansion card 50, and the expansion card 50 is inserted into the motherboard 114. The expansion card 50 is, for instance, a display card, a memory card, or any other similar expansion card, which should however not be construed as a limitation in the disclosure.

Figure 3:
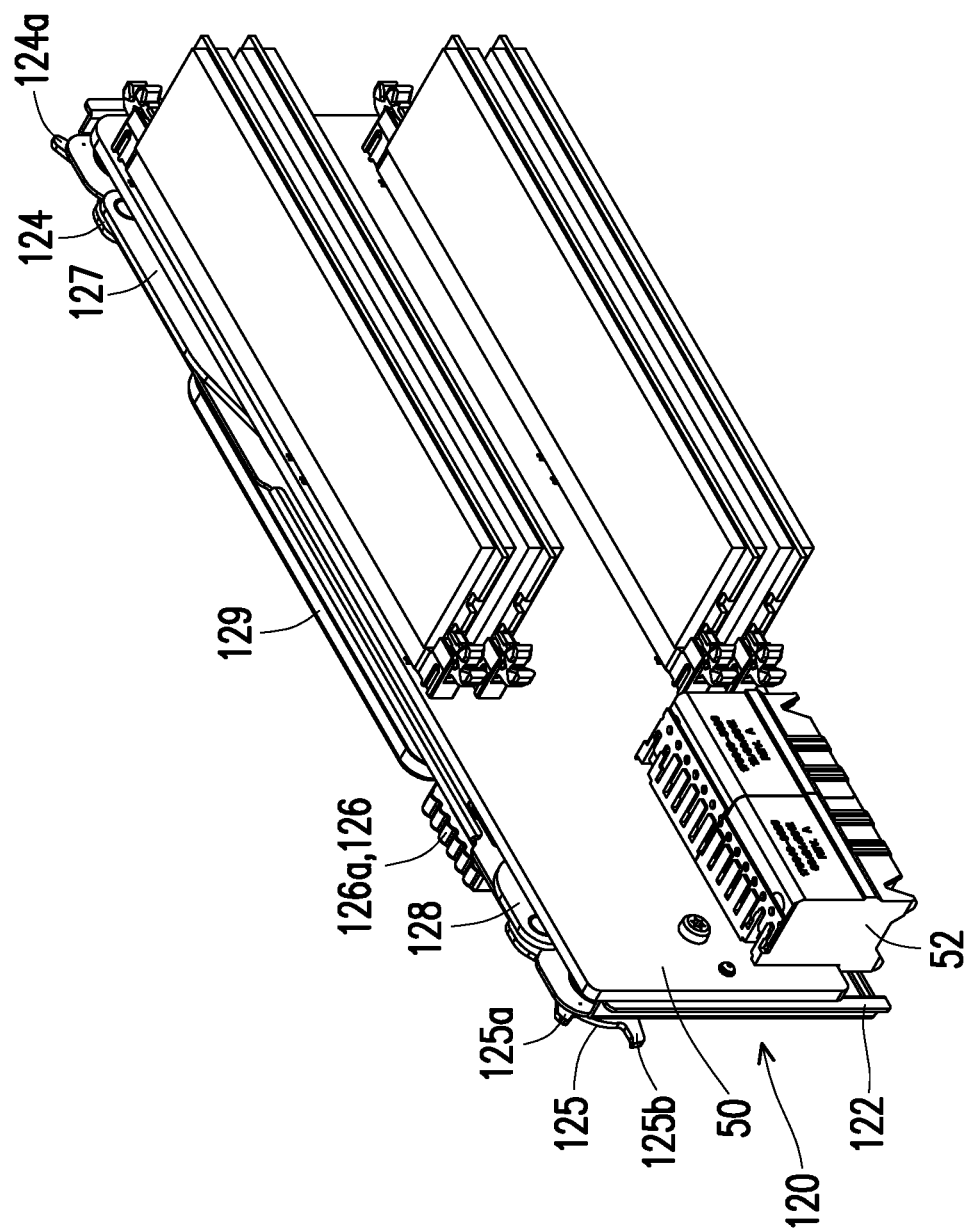
FIG. 3 is a three-dimensional view illustrating the carrying structure and the expansion card in FIG. 1 at another view angle.
Figure 4:
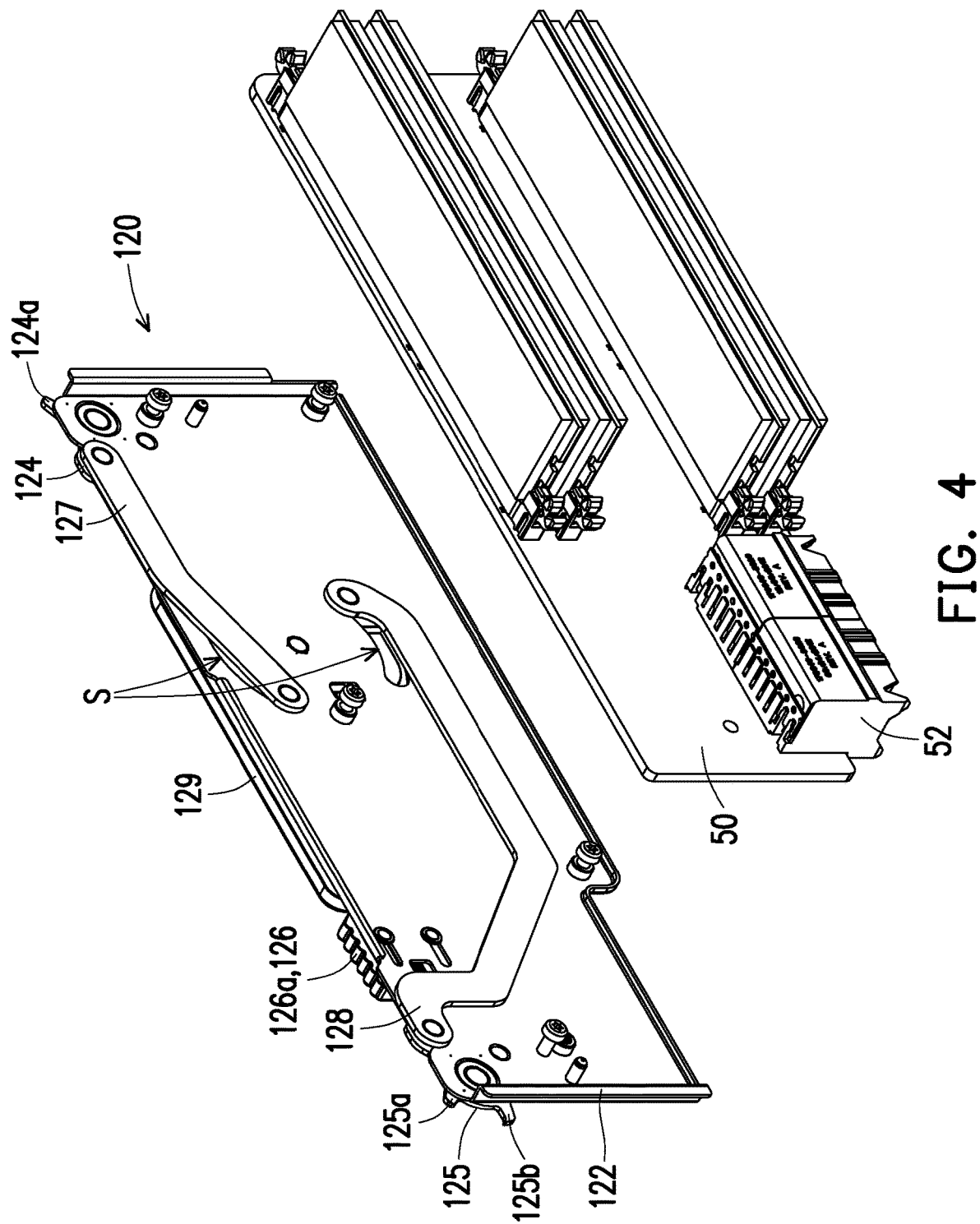
FIG. 4 is an exploded view illustrating the carrying structure and the expansion card in FIG. 3.
Figure 5:
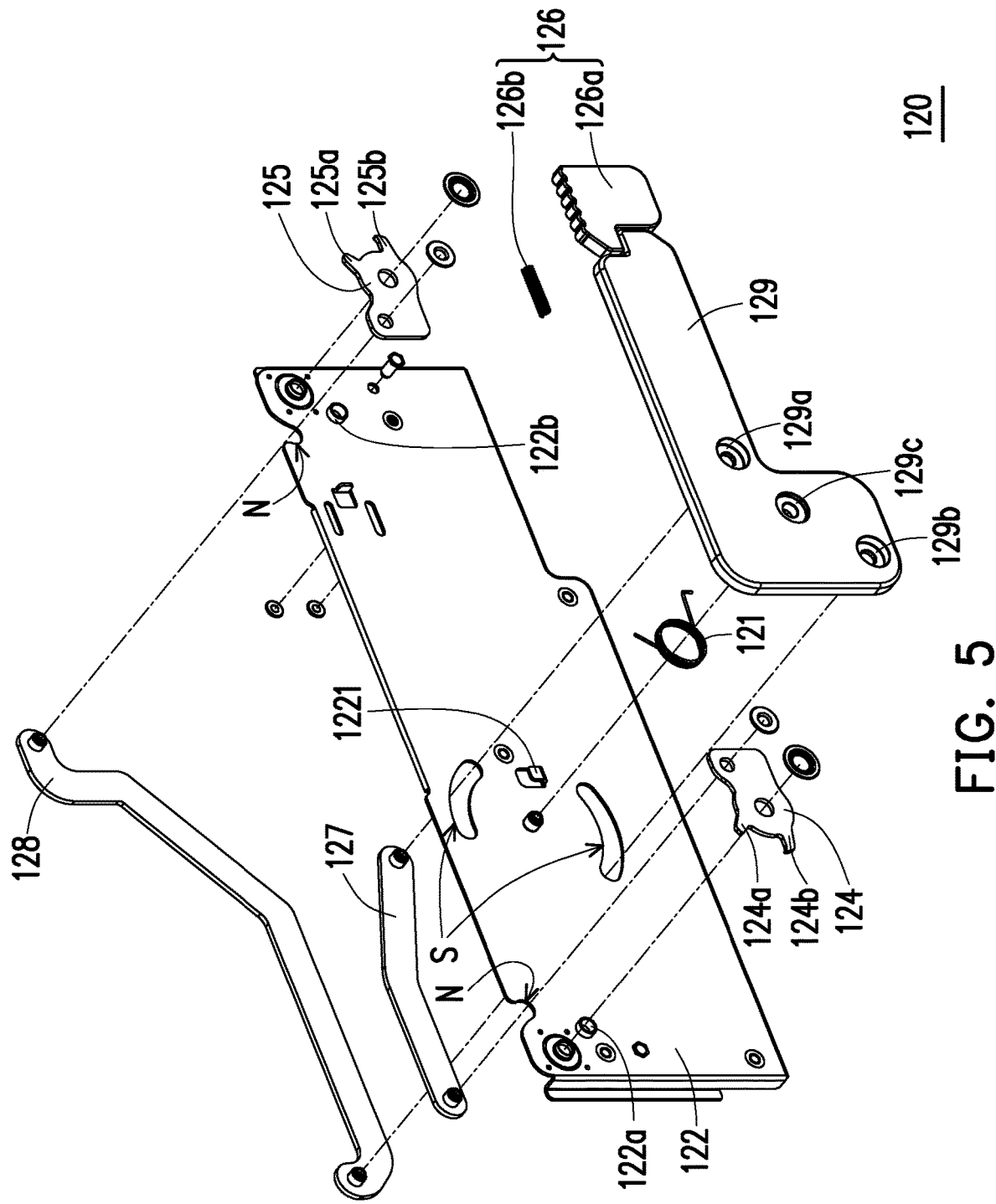
FIG. 5 is an exploded view illustrating some components of the carrying structure in FIG. 3.

FIG. 3 is a three-dimensional view illustrating the carrying structure and the expansion card in FIG. 1 at another view angle. FIG. 4 is an exploded view illustrating the carrying structure and the expansion card in FIG. 3. FIG. 5 is an exploded view illustrating some components of the carrying structure in FIG. 3. With reference to FIG. 3 to FIG. 5, each carrying structure 120 provided in the embodiment further includes an engaging component 124, an engaging component 125, a driven linkage 127, a driven linkage 128, and a driving linkage 129. The two engaging components 124 and 125 are disposed on opposite ends of the carrying main body 122, respectively. The two driving linkages 127 and 128 are respectively connected to the two engaging components 124 and 125. The driving linkage 129 is connected between the two driving linkages 127 and 128.

Figure 6A:
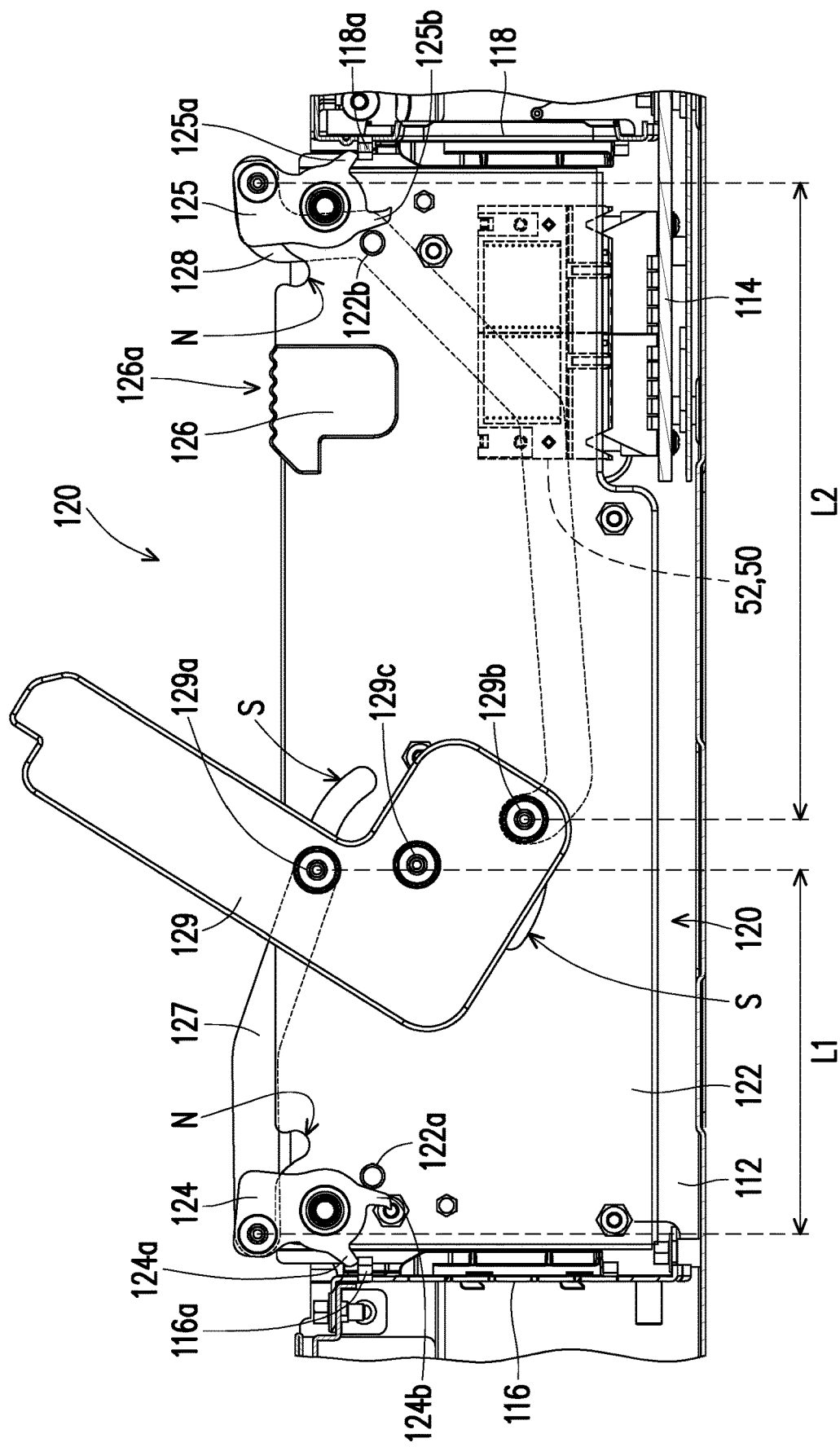
FIG. 6A to FIG. 6C are flowcharts illustrating actuation of the carrying structure in FIG. 1.
Figure 6B:
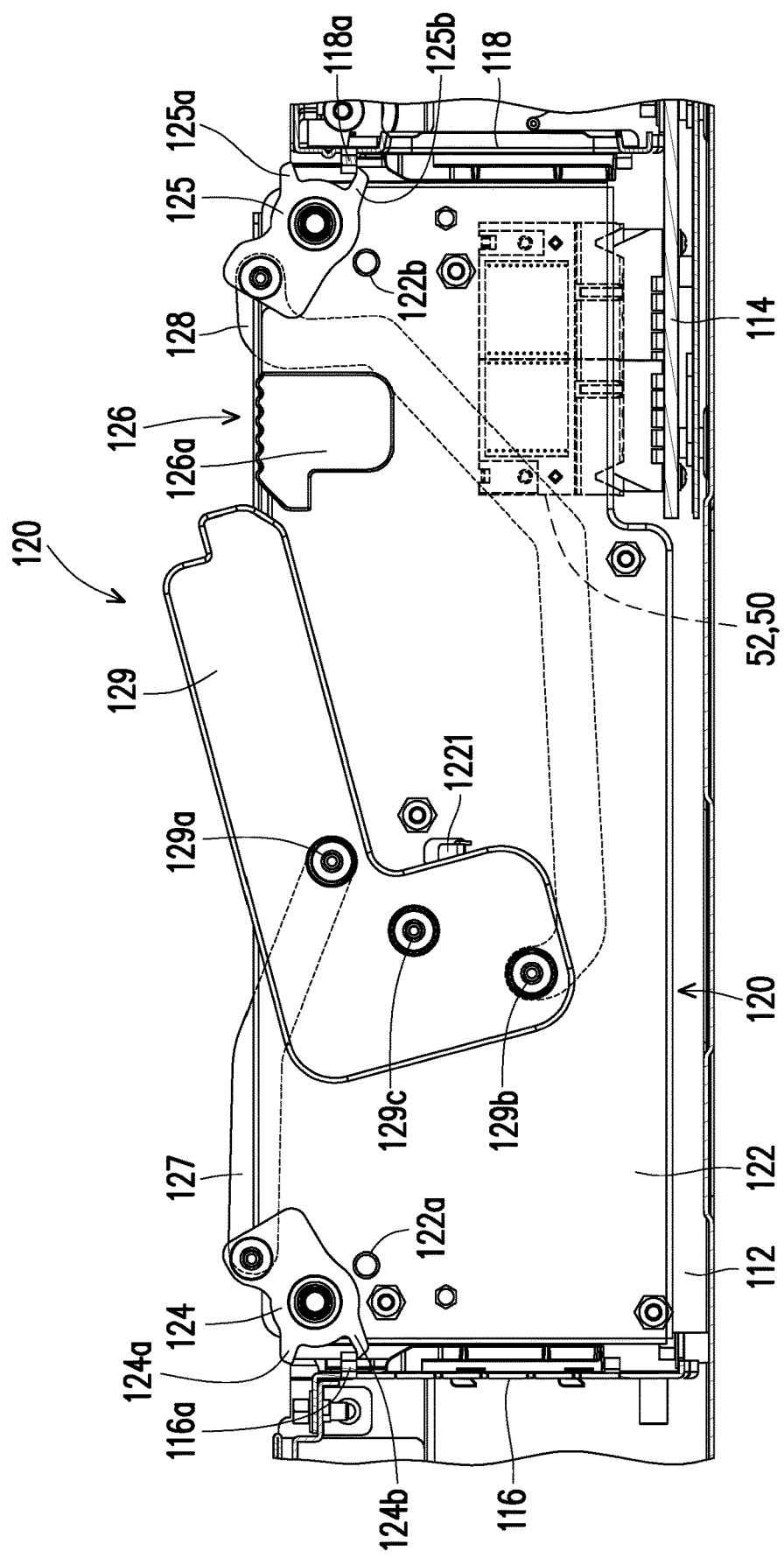
Figure 6C:
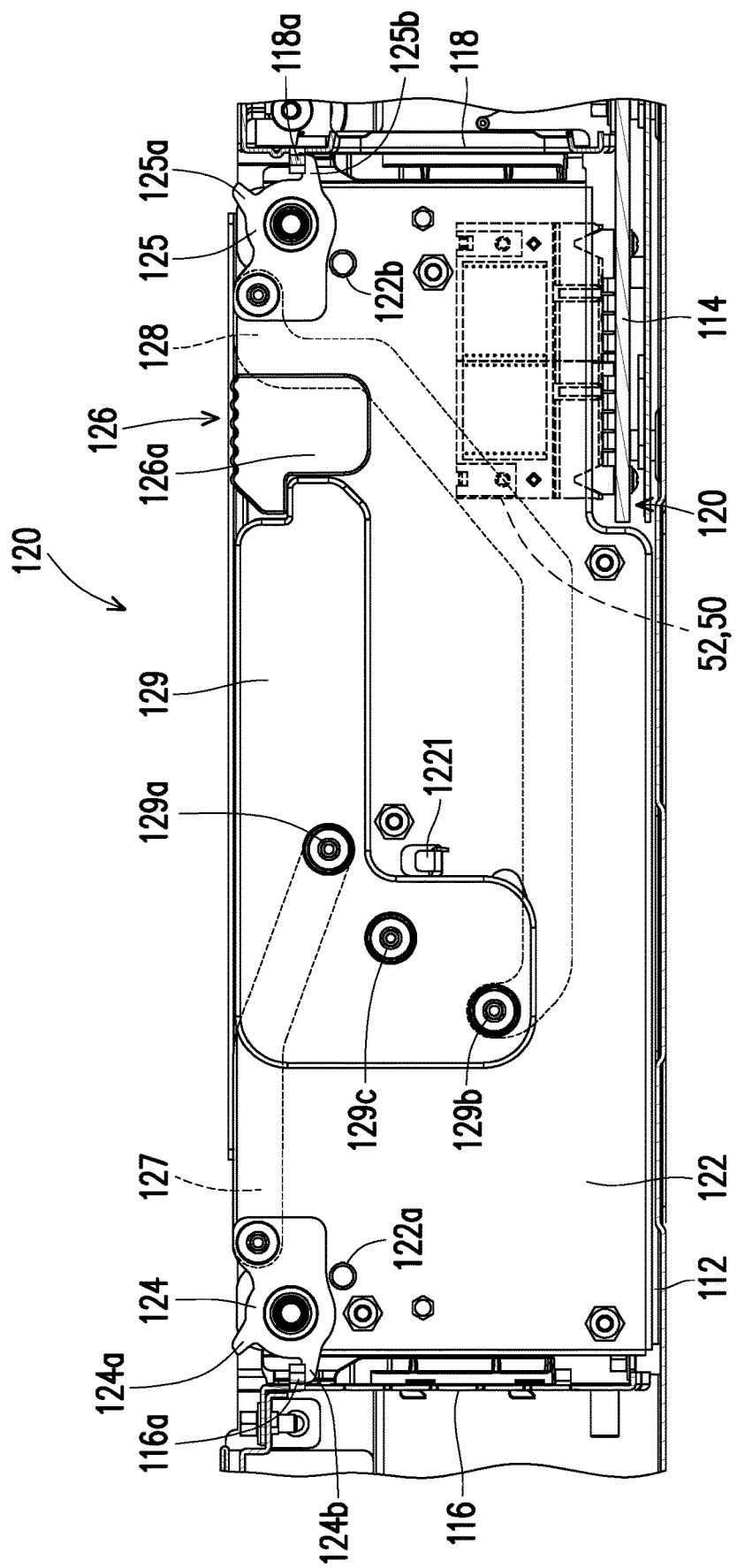

FIG. 6A to FIG. 6C are flowcharts illustrating actuation of the carrying structure in FIG. 1. The driving linkage 129 is adapted to simultaneously drive the two engaging components 124 and 125 to be actuated between a releasing state shown in FIG. 6A and an engaging state shown in FIG. 6C through the two driven linkages 127 and 128. When the two engaging components 124 and 125 are actuated to the engaging state, the two engaging components 124 and 125 are respectively engaged to the two partition boards 116 and 118 of the server main body 110, and an inserting portion 52 of the expansion card 50 carried by the carrying main body 122 is inserted into the motherboard 114. When the two engaging components 124 and 125 are actuated to the releasing state, the two engaging components 124 and 125 are separated from the two partition boards 116 and 118 of the server main body 110, so that the carrying structure 120 and the expansion card 50 may be moved away from the server main body 112.

As described above, the driving linkage 129 provided in the embodiment simultaneously drives the two engaging components 124 and 125 to be actuated through the two driven linkages 127 and 128, so that the two engaging components 124 and 125 are synchronously engaged to or separated from the two partition boards 116 and 118 of the server main body 110. Accordingly, a user may be prevented from exerting different forces to the two driven linkages 127 and 128 at different speeds and/or rotation angles during the installation or removal of the expansion card 50, so that a connector of the expansion card 50 is not tilted, and the probability of damages to the connector may be lowered.

Method of connecting the engaging component 124, the engaging component 125, the driven linkage 127, the driven linkage 128, and the driving linkage 129 are described in the following embodiment. The driven linkages 127 and 128 and the driving linkage 129 are located at opposite sides of the carrying main body 122, respectively. The carrying main body 122 has two open slots S, and two connection portions 129a and 129b of the driving linkage 129 are connected to the two driven linkages 127 and 128 through the two open slots S, respectively. A central portion 129c of the driving linkage 129 located between the two connection portions 129a and 129b is rotatably connected to the carrying main body 122. The driven linkages 127 and 128 and the engaging components 124 and 125 are located at opposite sides of the carrying main body 122, respectively. The carrying main body 122 has two concave openings N, and the two driven linkages 127 and 128 are rotatably connected to the two engaging components 124 and 125 through the two concave openings N, respectively. The engaging components 124 and 125 are rotatably connected to the carrying main body 122. Stopper points 122a and 122b on the carrying main body 122 may limit a rotation range of the engaging components 124 and 125, respectively.

In view of the need to provide a greater force at the inserting portion 52 of the expansion card 50 to allow the inserting portion 52 to be inserted into the motherboard 114, in the embodiment, the inserting portion 52 of the expansion card 50 is located near the engaging component 124 and away from the engaging component 125, as shown in FIG. 6A, and a length L2 of the driven linkage 128 close to the inserting portion 52 of the expansion card 50 is designed to be greater than a length L1 of the driven linkage 127 away from the inserting portion 52 of the expansion card 50. According to the principle of leverage, the insertion of the inserting portion 52 on the right side is more labor-saving, and the force on the left side and the right side of the carrying structure 120 is even. Thereby, the inserting portion 52 of the expansion card 50 may be further ensured not to be tilted and damaged due to an uneven force.

In the embodiment, the carrying structure 120 further includes a positioning assembly 126 disposed at the carrying main body 122. When the engaging components 124 and 125 are in the engaging state shown in FIG. 6C, the driving linkage 129 is adapted to be positioned at the carrying main body 122 by the positioning assembly 126, so as to prevent the driving linkage 129 from unexpectedly moving the engaging components 124 and 125 to the releasing state and thus prevent the engagement between the inserting portion 52 of the expansion card 50 and the motherboard 114 from being loosened, thereby ensuring stability of signal connection.

Figure 7:
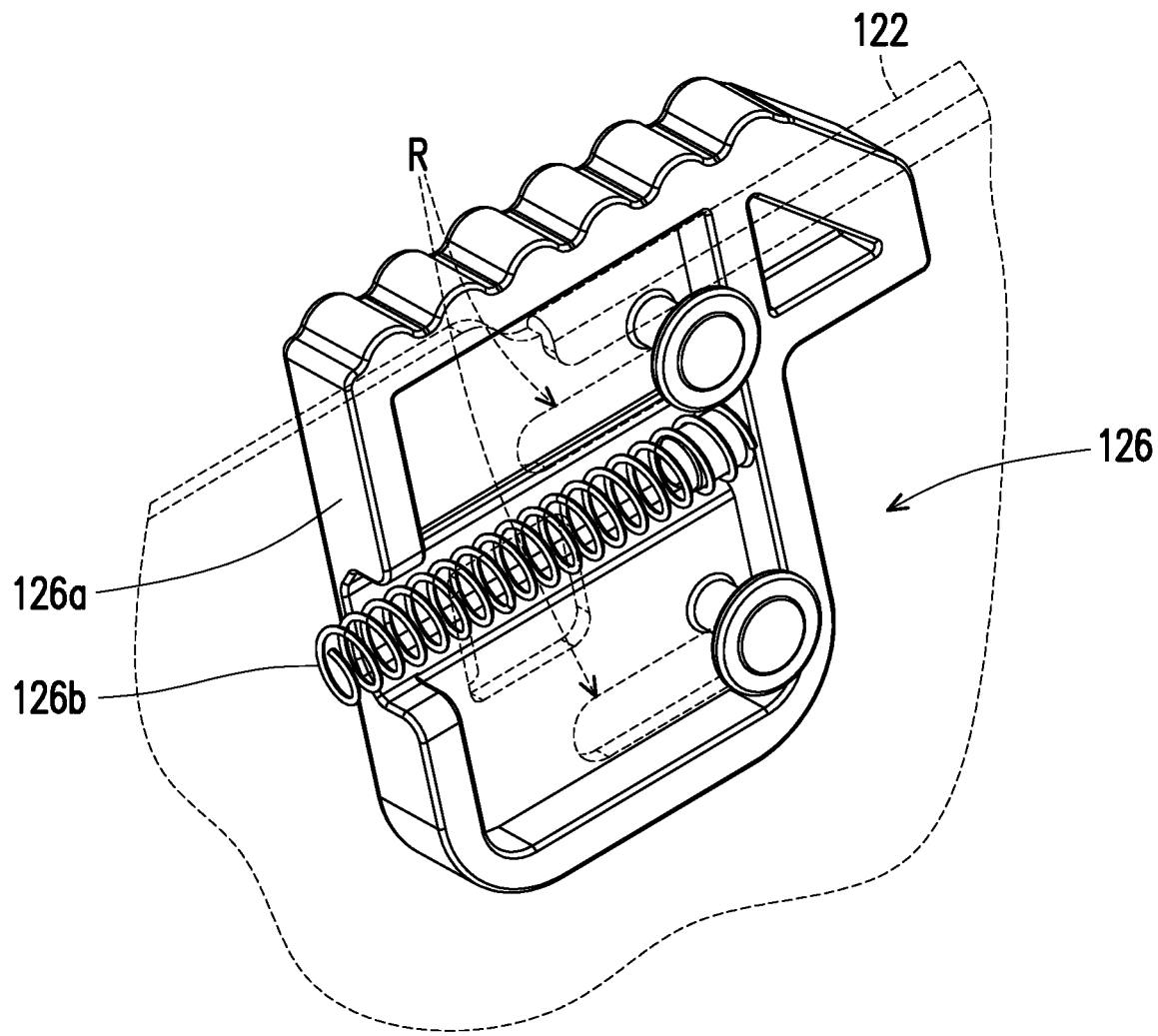
FIG. 7 is a three-dimensional view illustrating the positioning assembly 126 in FIG. 1.
Figure 8A:
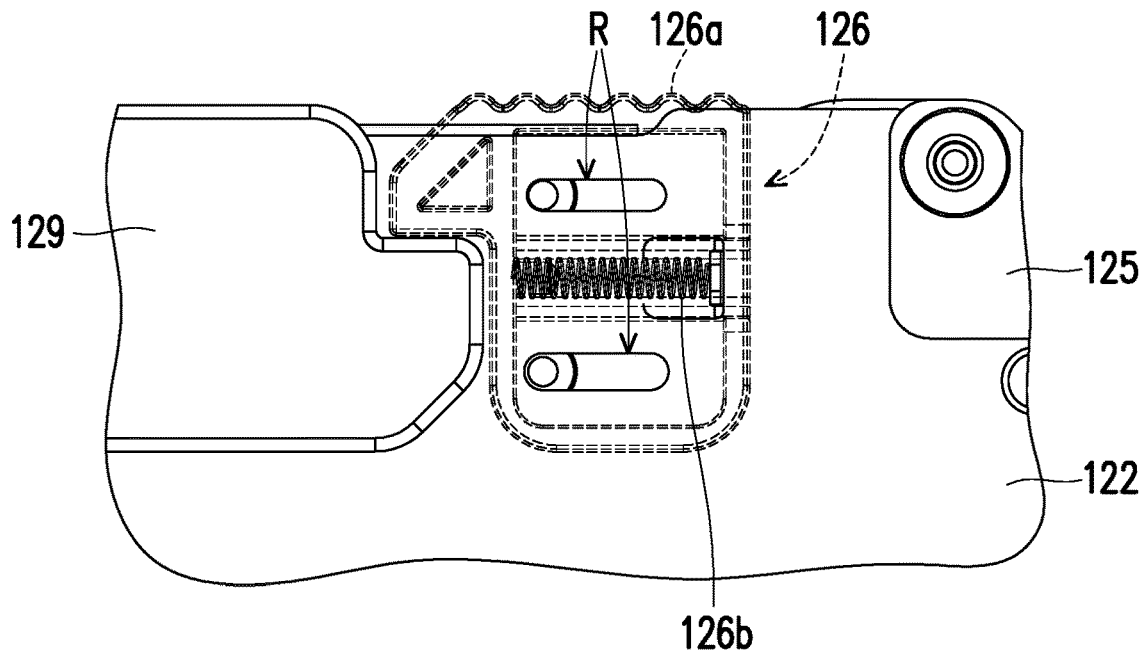
FIG. 8A and FIG. 8B are flowcharts illustrating the positioning assembly in FIG. 7.
Figure 8B:
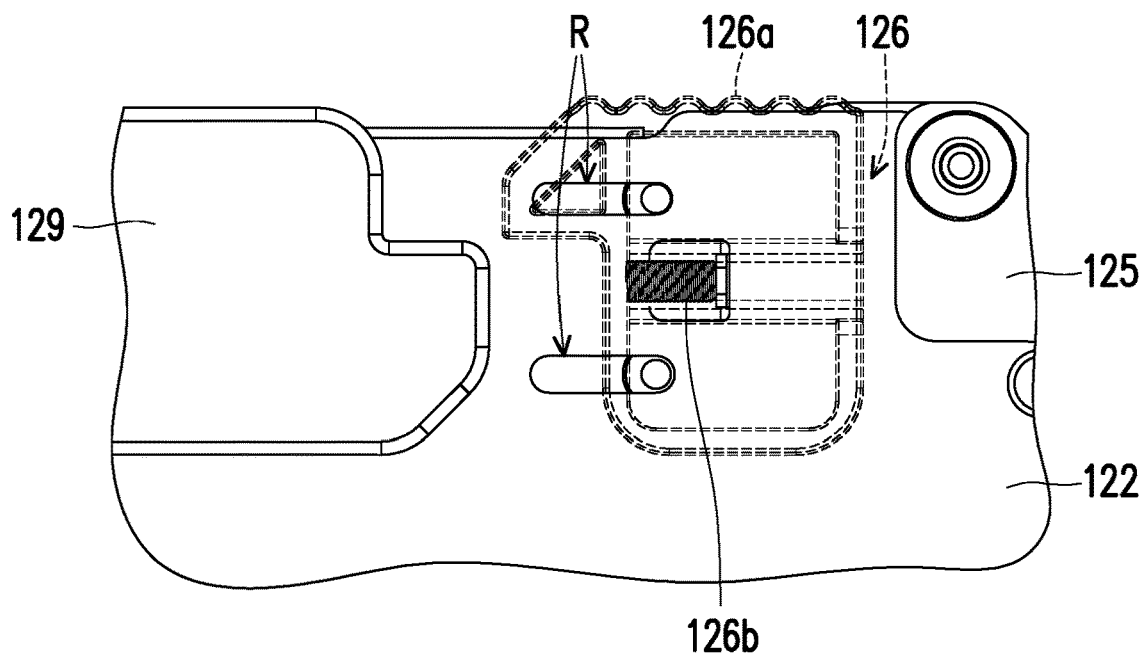

The positioning assembly 126 provided in the embodiment is elaborated below. FIG. 7 is a three-dimensional view illustrating the positioning assembly 126 in FIG. 1. FIG. 8A and FIG. 8B are flowcharts illustrating the positioning assembly in FIG. 7. The positioning assembly 126 provided in the embodiment includes a positioning sliding block 126a and an elastic component 126b, the positioning sliding block 126a is slidably mounted onto the carrying main body 122 by two guiding grooves R of the carrying main body 122. The elastic component 126b is, for instance, a compression spring, which is disposed in the positioning sliding block 126a and is connected between the positioning sliding block 126a and the carrying main body 122. The positioning sliding block 126a is adapted to move to a first location shown in FIG. 8A by an elastic force of the elastic component 126b to position the driving linkage 129, and the positioning sliding block 126a is adapted to resist the elastic force of the elastic component 126b and move to a second location shown in FIG. 8B to release the driving linkage 129. In other embodiments, the positioning assembly 126 may be in other forms, which should however not be construed as a limitation in the disclosure.

Figure 9:
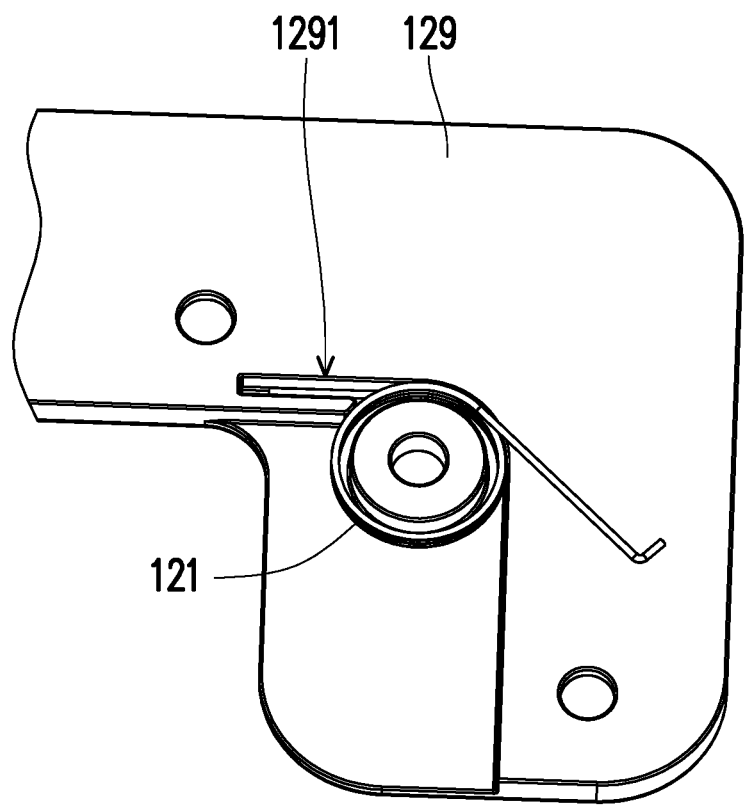
FIG. 9 is a partially enlarged view illustrating the driving linkage in FIG. 1.
Figure 10A:
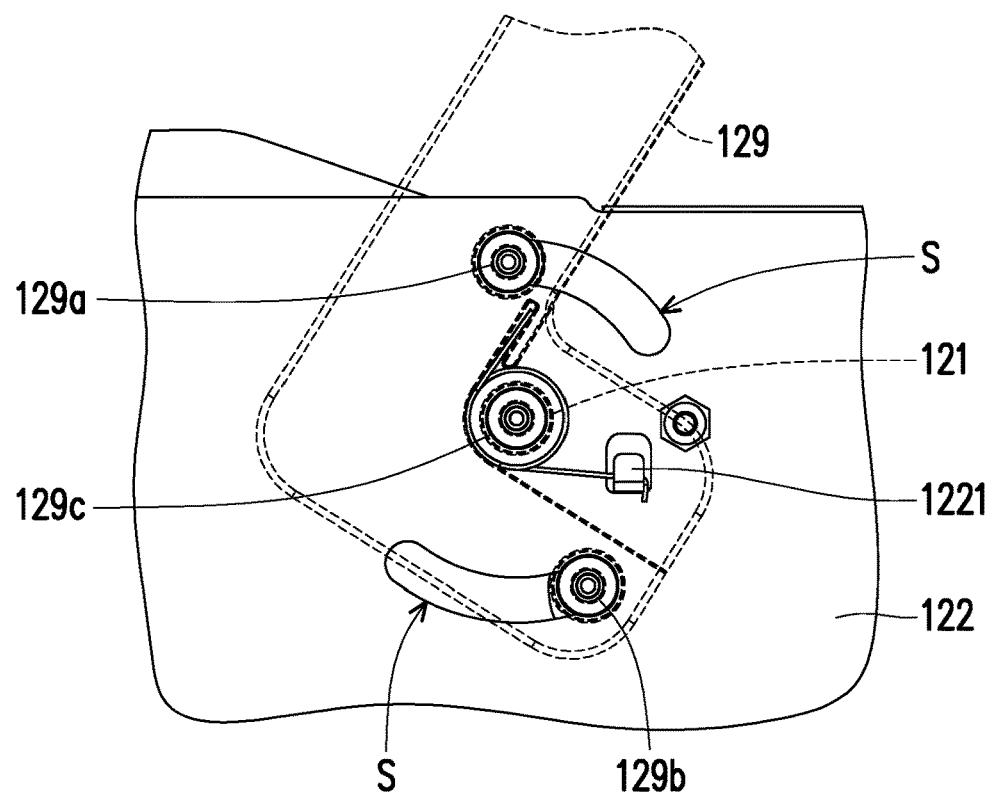
FIG. 10A and FIG. 10B are flowcharts illustrating actuation of the driving linkage in FIG. 1.
Figure 10B:
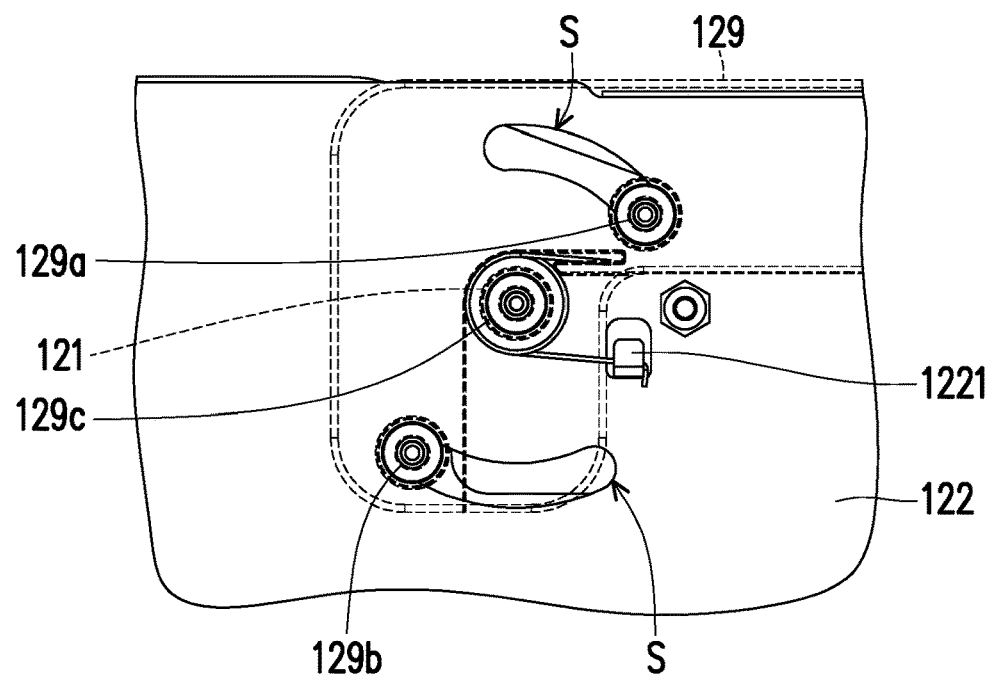

FIG. 9 is a partially enlarged view illustrating the driving linkage in FIG. 1. FIG. 10A and FIG. 10B are flowcharts illustrating actuation of the driving linkage in FIG. 1. The carrying structure 120 provided in the embodiment further includes another elastic component 121, which is, for instance, a torsion spring. One end of the elastic component 121 is fixed to a groove 1291 of the driving linkage 129 as shown in FIG. 9, and the other end of the elastic component 121 abuts against an abutting portion 1221 of the carrying main body 122 as shown in FIG. 10A and FIG. 10B. That is, the elastic component 121 is connected between the driving linkage 129 and the carrying main body 122. In the state shown in FIG. 10B, the driving linkage 129 resists an elastic force of the elastic component 121 to keep the engaging components 124 and 125 to be in the engaging state shown in FIG. 6C, and the driving linkage 129 may drive the engaging components 124 and 125 to be actuated to the releasing state shown in FIG. 6A by the elastic force of elastic component 121 actuating to the state shown in FIG. 10A.

The overall actuation process of the carrying structure 120 provided in the embodiment is elaborated below. When the user places the carrying structure 120 and the expansion card 50 thereon to a place between the two partition boards 116 and 118 along a guiding portion of the partition boards 116 and 118 (the guiding portion 116b shown in FIG. 2), and when the carrying structure 120 and the expansion card 50 thereon have not been fully installed to the server main body 110, the carrying structure 120 is in the state shown in FIG. 6A. At this time, the engaging components 124 and 125 are in the releasing state, and protrusions 124a and 125a of the engaging components 124 and 125 abut against upper ends of protrusions 116a and 118a of the partition boards 116 and 118, respectively, so that the carrying structure 120 and the expansion card 50 are not in contact with the motherboard 114 and away from the motherboard 114. The user may pull the driving linkage 129 as shown in FIG. 6A and FIG. 6B, so that the driven linkages 127 and 128 are driven to rotate the engaging components 124 and 125, respectively, whereby the protrusions 124b and 125b of the engaging components 124 and 125 respectively abut against lower ends of the protrusions 116a and 118a of the partition boards 116 and 118. During the process, the carrying structure 120 and the expansion card 50 descend to the location shown in FIG. 6B, but the inserting portion 52 of the expansion card 50 has not yet been inserted into the motherboard 114.

Next, the user may continue pulling the driving linkage 129 as shown in FIG. 6B to FIG. 6C, and the driven linkages 127 and 128 respectively drive the engaging components 124 and 125 to continuously rotate, whereby the protrusions 124b and 125b of the engaging components 124 and 125 respectively push the lower ends of the protrusions 116a and 118a abutting against the partition board 116 and 118. As such, the carrying structure 120 and the expansion card 50 continue to descend to the location shown in FIG. 6C, and the inserting portion 52 of the expansion card 50 is inserted into the motherboard 114 at this time. During the process, the positioning sliding block 126a is pushed by the driving linkage 129 to resist the elastic force of the elastic component 126b (shown in FIG. 8A and FIG. 8B) to move in a direction opposite to the driving linkage 129. After the driving linkage 129 reaches the location shown in FIG. 6C, the positioning sliding block 126a is restored toward the direction of the driving linkage 129 by the elastic force of the elastic component 126b (shown in FIG. 8A and FIG. 8B) to position the driving linkage 129. So far, the installation of the carrying structure 120 and the expansion card 50 is completed.

When the user intends to disassemble the carrying structure 120 and the expansion card 50, the elastic force of the elastic component 126b (shown in FIG. 8A and FIG. 8B) may be resisted to move the positioning sliding block 126a depicted in FIG. 6C toward a direction opposite to the driving linkage 129 to release the driving linkage 129, so that the driving linkage 129 is rotated by the elastic force of the elastic component 121 (shown in FIG. 10A and FIG. 10B) to the state shown in FIG. 6B. At this time, the user may pull the driving linkage 129 as shown in FIG. 6B to FIG. 6C to drive the engaging components 124 and 125 to rotate to the state shown in FIG. 6C; by the protrusions 124a and 125a of the engaging components 124 and 125 abutting against the upper ends of the protrusions 116a and 118a of the partition boards 116 and 118, the carrying structure 120 and the expansion card 50 are moved away from the motherboard 114. At this time, the inserting portion 52 of the expansion card 50 is separated from the motherboard 114, and the carrying structure 120 is released by the engaging components 124 and 125. So far, the disassembly of the carrying structure 120 and the expansion card 50 is completed.

Figure 11:
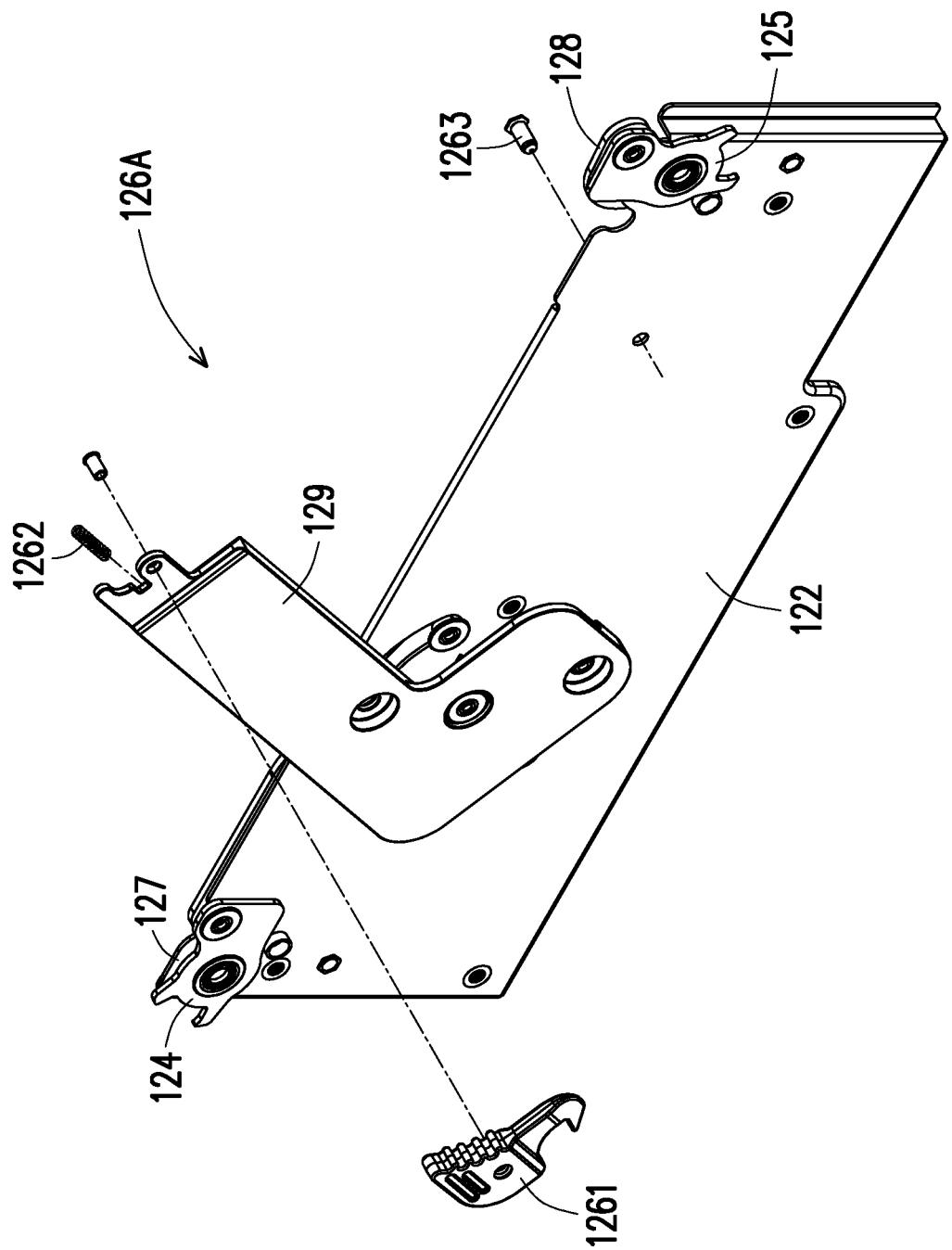
FIG. 11 is an exploded view illustrating some components of a carrying structure according to another embodiment of the disclosure.
Figure 12:
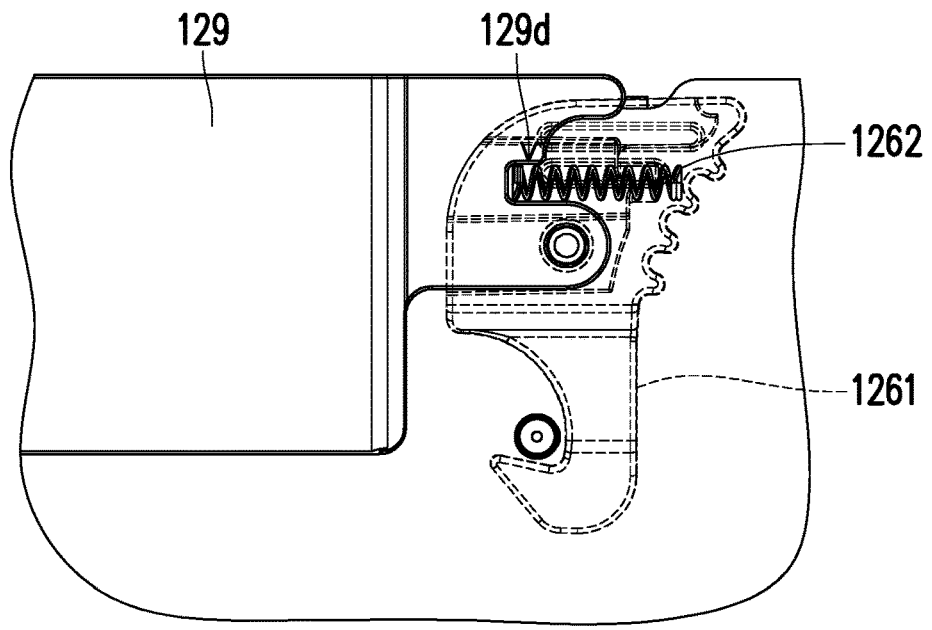
FIG. 12 is a partially enlarged view illustrating the driving linkage and the positioning assembly in FIG. 11.
Figure 13:
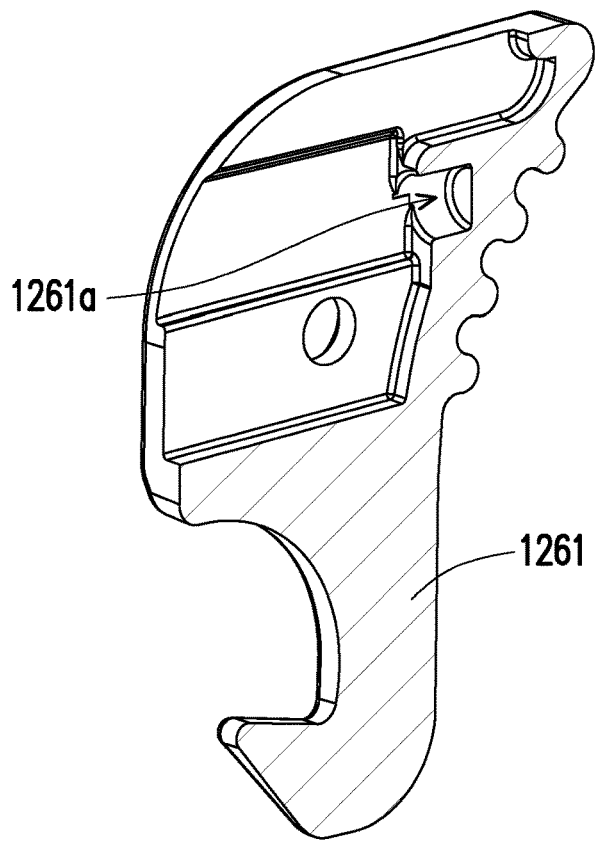
FIG. 13 is a perspective view illustrating a partial structure of the engaging hook in FIG. 11.
Figure 14A:
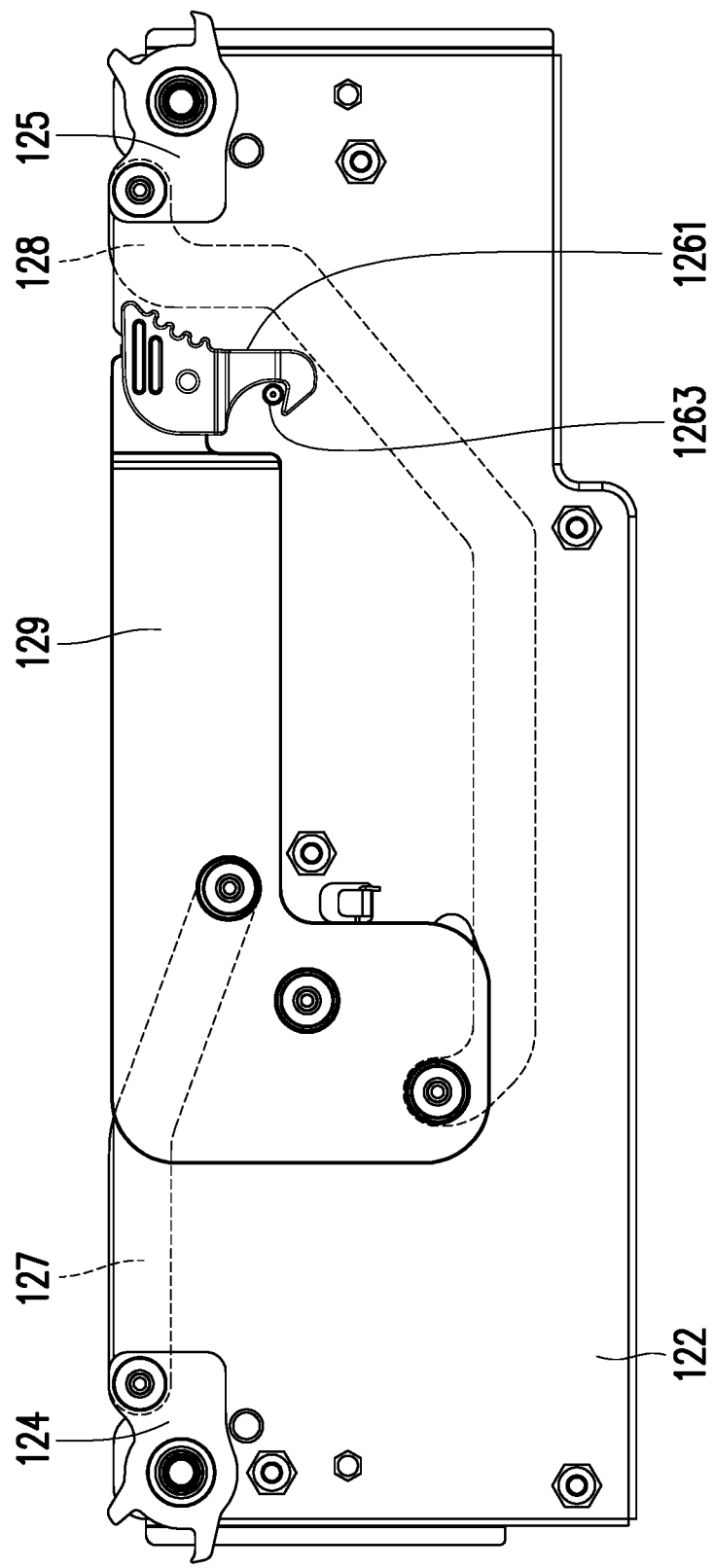
FIG. 14A to FIG. 14C are flowcharts illustrating actuation of the positioning assembly in FIG. 11.
Figure 14B:
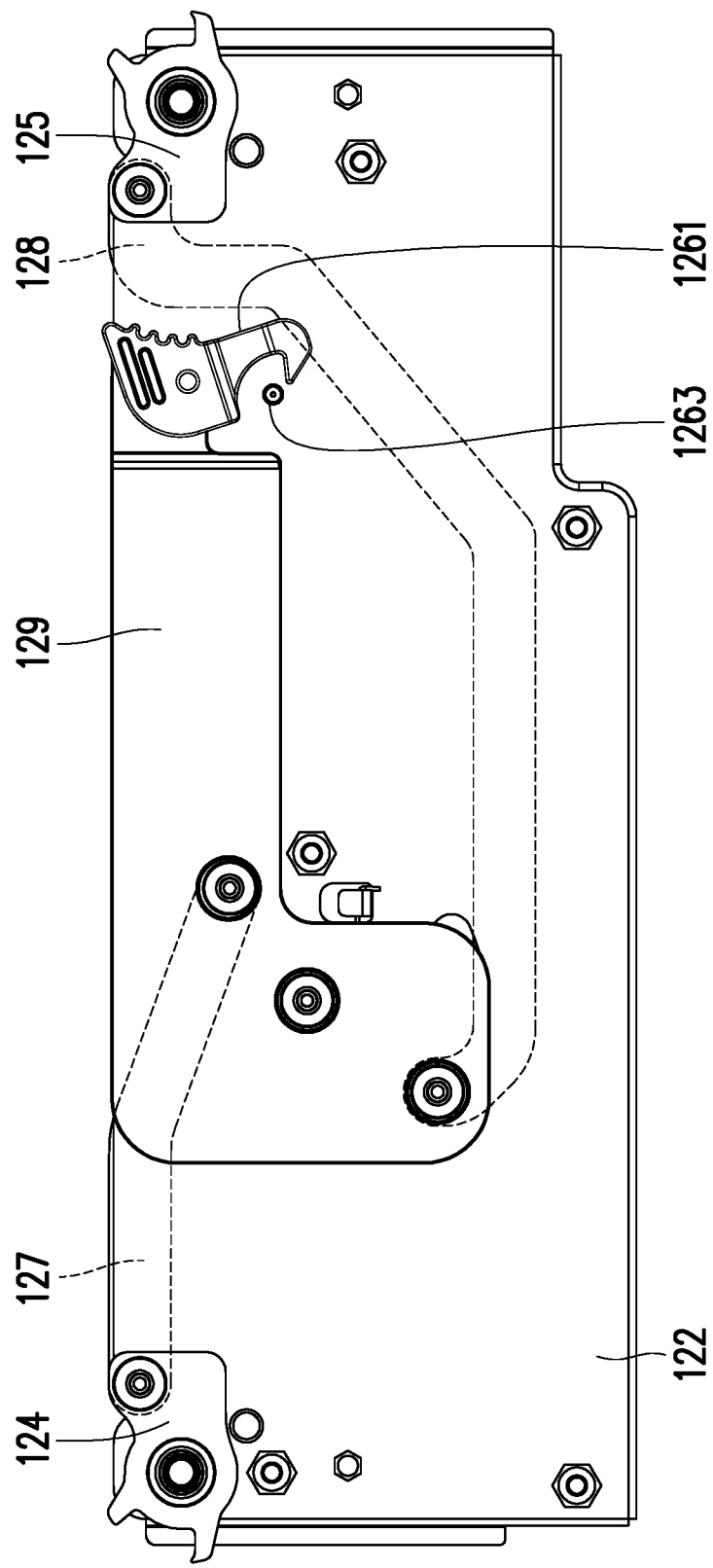
Figure 14C:
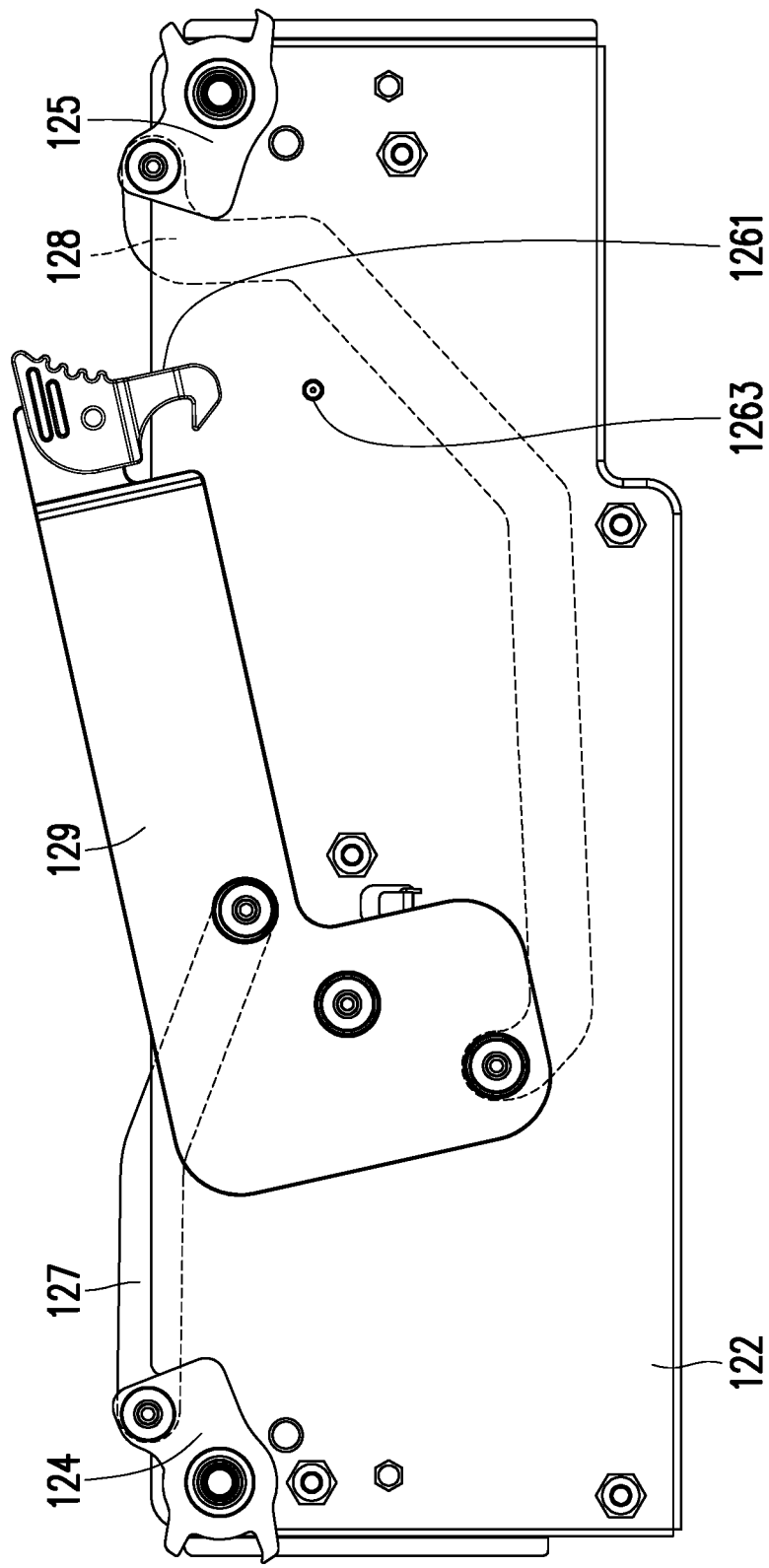

Other embodiments of the positioning assembly are described below with reference to the drawings. FIG. 11 is an exploded view illustrating some components of a carrying structure according to another embodiment of the disclosure. FIG. 12 is a partially enlarged view illustrating the driving linkage and the positioning assembly in FIG. 11. FIG. 13 is a perspective view illustrating a partial structure of the engaging hook in FIG. 11. The difference between the embodiment shown in FIG. 11 to FIG. 13 and the foregoing embodiments lies in that a positioning assembly 126A in FIG. 11 includes an engaging hook 1261, an elastic component 1262, and a pillar 1263. The engaging hook 1261 is rotatably connected to the driving linkage 129. The elastic component 1262 is, for instance, a tension spring, and two ends of the elastic component 1262 are respectively disposed at a concave portion 1261a of the engaging hook 1261 and a concave portion 129d of the driving linkage 129 and are connected between the engaging hook 1261 and the driving linkage 129. The pillar 1263 is disposed at the carrying main body 122. FIG. 14A to FIG. 14C are flowcharts illustrating actuation of the positioning assembly in FIG. 11. The engaging hook 1261 is adapted to be rotated to a first location shown in FIG. 14A by an elastic force of the elastic component 1262 to be engaged to the pillar 1263, and the engaging hook 1261 is adapted to resist the elastic force of the elastic component 1262 and rotate to the second location shown in FIG. 6B to be separated from the pillar 1263, so that the driving linkage 129 may rotate upward as shown in FIG. 6C.

Figure 15:
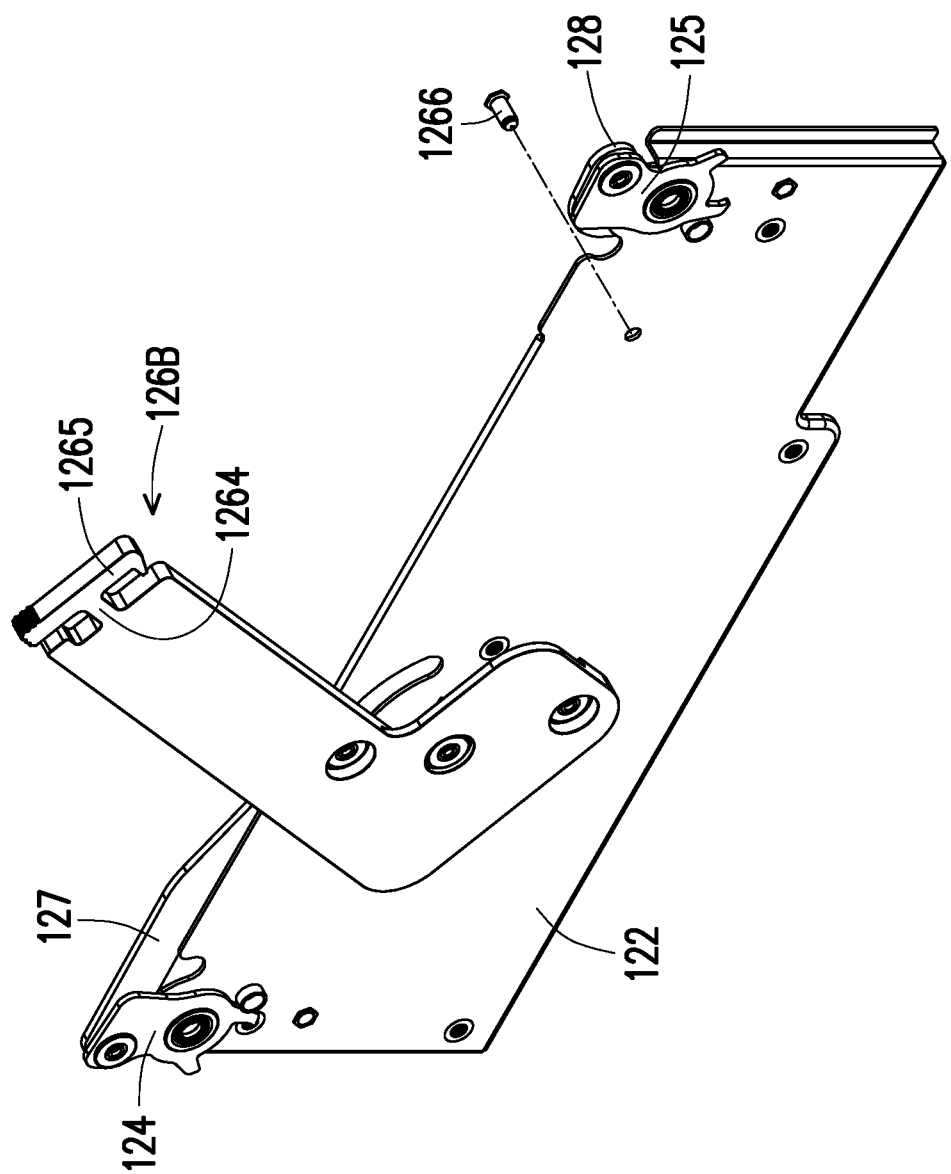
FIG. 15 is an exploded view illustrating some components of a carrying structure according to another embodiment of the disclosure.
Figure 16A:
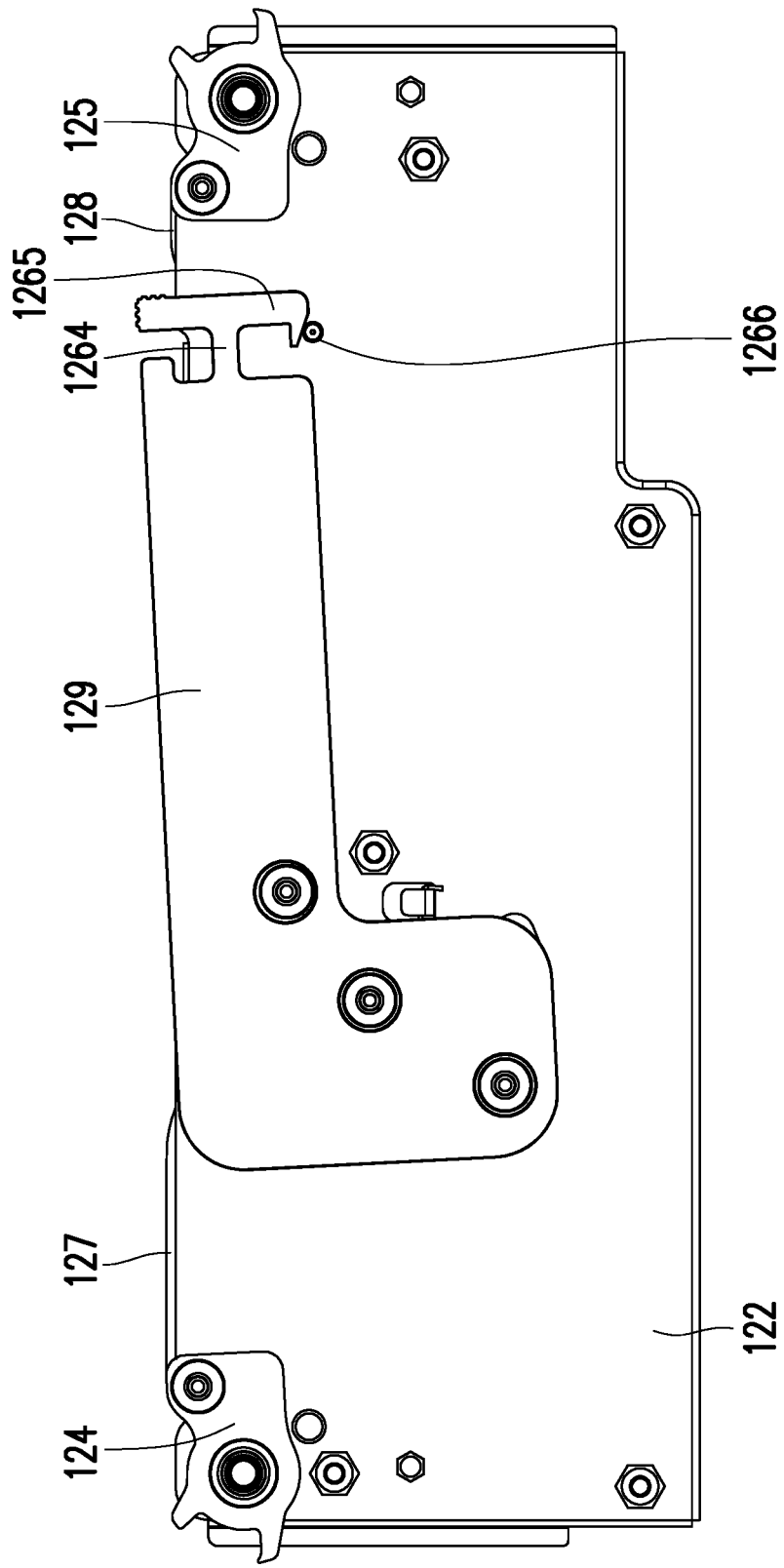
FIG. 16A to FIG. 16C are flowcharts illustrating actuation of the positioning assembly in FIG. 15.
Figure 16B:
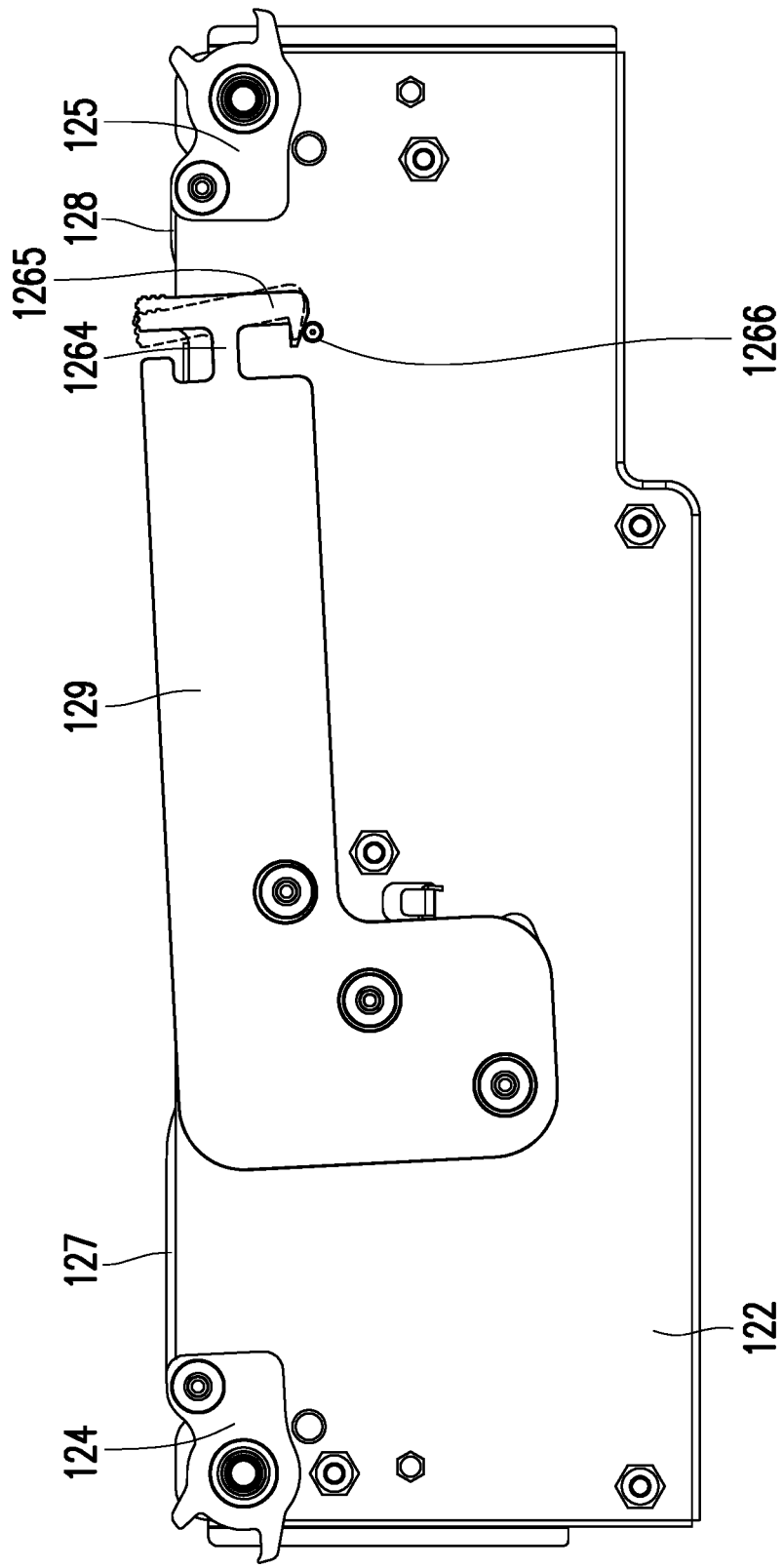
Figure 16C:
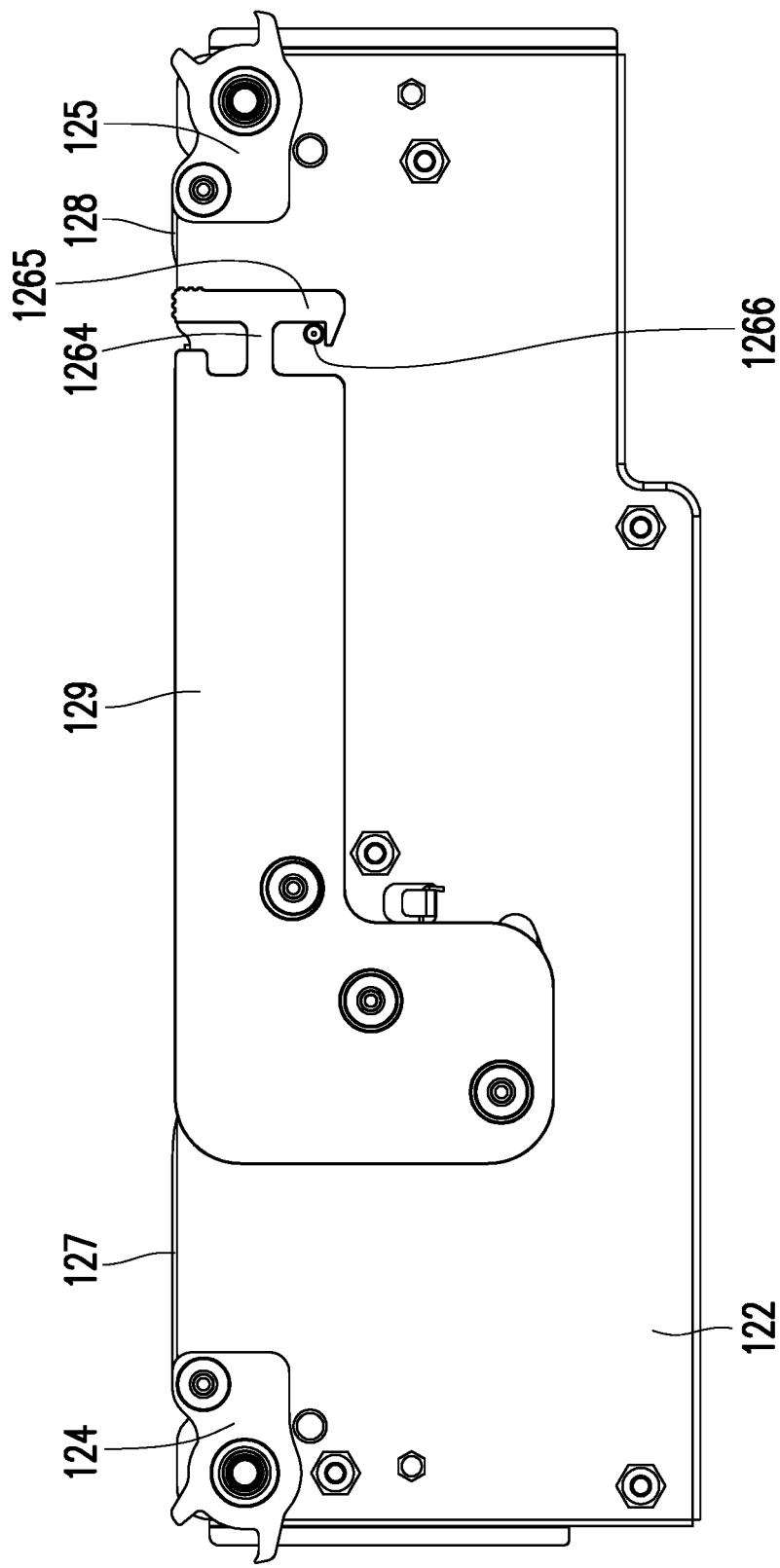

FIG. 15 is an exploded view illustrating some components of a carrying structure according to another embodiment of the disclosure. The difference between the embodiment shown in FIG. 15 and the foregoing embodiments lies in that a positioning assembly 126B in FIG. 15 includes an elastic arm 1264, an engaging hook 1265, and a pillar 1266. The elastic arm 1264 is integrally connected between the driving linkage 129 and the engaging hook 1265, and the pillar 1266 is disposed at the carrying main body 122. FIG. 16A to FIG. 16C are flowcharts illustrating actuation of the positioning assembly in FIG. 15. With the elastic deformation of the elastic arm 1264, as shown by the dotted line in FIG. 16B, the engaging hook 1265 may correspondingly deviate from the first location in the direction opposite to the driving linkage 129 to the second location, so as to be adapted to engage the engaging hook 1265 to the pillar 1266 at the first location as shown in FIG. 16C or separate the engaging hook 1265 from the pillar 1266 at the second location as shown in FIG. 16A.

To sum up, the driving linkage provided in one or more embodiments of the disclosure simultaneously drives the two engaging components to be actuated through the two driven linkages, so that the two engaging components are synchronously engaged to or separated from the server main body. Accordingly, the user may be prevented from exerting different forces to the two driven linkages at different speeds and/or rotation angles during the installation or removal of the expansion card, so that the connector of the expansion card is not tilted, and the probability of damages to the connector may be lowered. In addition, in view of the need to provide a greater force at the inserting portion of the expansion card to allow the inserting portion to be inserted into the motherboard 114, the length of the driven linkage close to the inserting portion of the expansion card is designed to be greater than the length of the driven linkage away from the inserting portion of the expansion card. According to the principle of leverage, the insertion of the inserting portion on the right side is more labor-saving, and the force on the left side and the right side of the carrying structure is even. Thereby, the inserting portion 52 of the expansion card 50 may be further ensured not to be tilted and damaged due to an uneven force. Moreover, the positioning assembly may be applied to position the driving linkage, so as to prevent the driving linkage from unexpectedly driving the engaging components to be actuated and thus prevent the engagement between the inserting portion of the expansion card and the motherboard 114 from being loosened, thereby ensuring stability of signal.

Although the disclosure has been described with reference to the above embodiments, the embodiments are not intended to limit the disclosure. A person of ordinary skill in the art may make variations and improvements without departing from the spirit and scope of the disclosure. In view of the foregoing, it is intended that the disclosure covers modifications and variations provided that they fall within the scope of the following claims and their equivalents.

What is claimed is:
1. A carrying structure, comprising:
a carrying main body, adapted to carry an expansion card;
two engaging components, respectively disposed on opposite ends of the carrying main body;
two driven linkages, respectively connected to the two engaging components; and a driving linkage, connected between the two driven linkages and adapted to simultaneously drive the two engaging components to be actuated by the two driven linkages, wherein the two driven linkages and the driving linkage are respectively disposed on opposite surfaces of the carrying main body.

2. The carrying structure according to claim 1, wherein each of the engaging components is adapted to be actuated to an engaging state for being engaged to a server main body, each of the engaging components is adapted to be actuated to a releasing state for being separated from the server main body, and the driving linkage is adapted to simultaneously drives the two engaging components to be actuated between the engaging state and the releasing state by the two driven linkages.

3. The carrying structure according to claim 1, wherein when the expansion card is carried by the carrying main body, an inserting portion of the expansion card is adapted to be inserted into the server main body, and a length of one of the driven linkages close to the inserting portion is greater than a length of the other driven linkage away from the inserting portion.

4. The carrying structure according to claim 1, further comprising a positioning assembly, wherein at least one portion of the positioning assembly is disposed at the carrying main body, and when each of the engaging components is in the engaging state, the driving linkage is adapted to be positioned at the carrying main body by the positioning assembly.

5. The carrying structure according to claim 4, wherein the positioning assembly comprises a positioning component and an elastic component, the positioning component is adapted to move to a first location to position the driving linkage by an elastic force of the elastic component, and the positioning component is adapted to resist the elastic force of the elastic component and move to a second location to release the driving linkage.

6. The carrying structure according to claim 5, wherein the positioning component of the positioning assembly is slidably disposed at the carrying main body, and the elastic component is connected between the carrying main body and the positioning component.

7. The carrying structure according to claim 5, wherein the positioning component of the positioning assembly is rotatably disposed at the driving linkage, and the elastic component is connected between the positioning component and the driving linkage.

8. The carrying structure according to claim 7, wherein the positioning assembly comprises a pillar disposed at the carrying main body, and the positioning component cooperates with the pillar to position the driving linkage.

9. The carrying structure according to claim 7, wherein the elastic component is an elastic arm, and the elastic arm, the driving linkage, and the positioning component are integrally formed.

10. The carrying structure according to claim 2, further comprising an elastic component connected between the driving linkage and the carrying main body, wherein the driving linkage is adapted to resist an elastic force of the elastic component and keep each of the engaging components to be in the engaging state, and the driving linkage is adapted to drive each of the engaging components to be actuated to the releasing state by the elastic force of the elastic component.

11. The carrying structure according to claim 1, wherein each of the engaging components is rotatably connected to the carrying main body; and each of the driven linkages is rotatably connected to a corresponding engaging component of the engaging components and is rotatably connected to the driving linkage.

12. The carrying structure according to claim 1, wherein two connection portions of the driving linkage are respectively rotatably connected to the two driven linkages, and a central portion of the driving linkage located between the two connection portions is rotatably connected to the carrying main body.

13. The carrying structure according to claim 1, wherein each of the driven linkages and the driving linkage are respectively located at opposite sides of the carrying main body, the carrying main body has two open slots, and the two driven linkages are respectively connected to the driving linkage through the two open slots.

14. The carrying structure according to claim 1, wherein each of the driven linkages and a corresponding engaging component of the engaging components are respectively located at opposite sides of the carrying main body, the carrying main body has two concave openings, and the two driven linkages are respectively connected to the two engaging components through the two concave openings.

15. A server, comprising:
a server main body; and
at least one carrying structure, comprising:
  a carrying main body, adapted to carry an expansion card;
  two engaging components, respectively disposed on opposite ends of the carrying main body, wherein each of the engaging components is adapted to be actuated to an engaging state for being engaged to the server main body, and each engaging component is adapted to be actuated to a releasing state for being separated from the server main body;
  two driven linkages, respectively connected to the two engaging components; and
  a driving linkage, connected between the two driven linkages and adapted to simultaneously drive the two engaging components to be actuated between the engaging state and the releasing state by the two driven linkages,
  wherein the two driven linkages and the driving linkage are respectively disposed on opposite surfaces of the carrying main body.

16. The server according to claim 15, wherein when the expansion card is carried by the carrying main body, an inserting portion of the expansion card is adapted to be inserted into the server main body, and a length of one of the driven linkages close to the inserting portion is greater than a length of the other driven linkage away from the inserting portion.

17. The server according to claim 15, wherein the at least one carrying structure further comprises a positioning assembly, at least one portion of the positioning assembly is disposed at the carrying main body, and when each of the engaging components is in the engaging state, the driving linkage is adapted to be positioned at the carrying main body by the positioning assembly.

18. The server according to claim 17, wherein the positioning assembly comprises a positioning component and an elastic component, the positioning component is adapted to move to a first location to position the driving linkage by an elastic force of the elastic component, and the positioning component is adapted to resist the elastic force of the elastic component and move to a second location to release the driving linkage.

19. The server according to claim 15, wherein the at least one carrying structure further comprises an elastic component connected between the driving linkage and the carrying main body, the driving linkage is adapted to resist an elastic force of the elastic component and keep each of the engaging components to be in the engaging state, and the driving linkage is adapted to drive each of the engaging components to be actuated to the releasing state by the elastic force of the elastic component.

20. The server according to claim 15, wherein the server main body comprises a chassis and two partition boards, the two partition boards are disposed in the chassis, and the at least one carrying structure is disposed between the two partition boards and adapted to be engaged to the two partition boards by the two engaging components, respectively.

* * * * *